United States Patent [19]
vonAllmen et al.

[11] 4,281,236
[45] Jul. 28, 1981

[54] PROCESS FOR THE MANUFACTURE OF ELECTRICAL CONTACTS UPON SEMICONDUCTOR COMPONENTS

[75] Inventors: Martin von Allmen, Pasadena, Calif.; Marc Wittmer, Baden, Switzerland

[73] Assignee: BBC Brown, Boveri & Co Limited, Baden, Switzerland

[21] Appl. No.: 79,216

[22] Filed: Sep. 26, 1979

[30] Foreign Application Priority Data

Oct. 31, 1978 [CH] Switzerland ............... 11195/78

[51] Int. Cl.³ .................................. B23K 27/00
[52] U.S. Cl. ................... 219/121 LC; 219/121 LD
[58] Field of Search .............. 219/121 LC, 121 LD, 219/121 LE, 121 LF, 121 EC, 121 ED; 357/67; 29/589, 590

[56] References Cited

U.S. PATENT DOCUMENTS

| | | | |
|---|---|---|---|
| 3,402,460 | 9/1968 | Smith | 219/121 LD X |
| 3,586,816 | 6/1971 | Hagen | 219/121 LC |
| 3,614,832 | 10/1971 | Chance et al. | 219/121 LD X |
| 3,934,073 | 1/1976 | Ardezzone | 219/121 L X |

*Primary Examiner*—C. L. Albritton
*Attorney, Agent, or Firm*—Oblon, Fisher, Spivak, McClelland & Maier

[57] ABSTRACT

A process for the manufacture of electrical contacts on semiconductor components, wherein a metallic layer is placed upon the surface of the semiconductor component with which contact is to be made, which layer is then sintered by heating to a predetermined temperature, characterized by the fact that the heating done for sintering purposes takes place by means of irradiation with laser light directed only upon the metallic layer, the intensity of the laser light being sufficient to bring the metallic layer and the semiconductor material to the melting point.

6 Claims, 5 Drawing Figures

PROCESS FOR THE MANUFACTURE OF ELECTRICAL CONTACTS UPON SEMICONDUCTOR COMPONENTS

BACKGROUND OF THE INVENTION

1. Field of the Invention

This invention relates to a process for the manufacture of electrical contacts upon semiconductor components, wherein a metallic layer is disposed upon the surface of a semiconductor element to be contacted and then is sintered by means of heating to a predetermined temperature.

2. Description of the Prior Art

The manufacture of such contacts is currently carried out in particular for silicium components (diodes, transistors, thyristors, integrated circuits, etc.). A thin film of the given metal is placed upon the component surface to be contacted by means of evaporation, sputtering, or electrochemical processes. Then, by means of sintering at a certain temperature, either the corresponding silicide (when platinum, palladium or nickel is used as a contact metal) or the corresponding silicide alloy (when aluminum, gold, or silver is used) is generated. Since under the known procedures the entire semiconductor component is heated for sintering, a predetermined maximum temperature cannot be exceeded; otherwise the structure of the component would be destroyed. Another disadvantage with the known procedures is that the sintering process must be carried out in an inert atmosphere.

SUMMARY OF THE INVENTION

Accordingly, one object of this invention is to provide a novel process for the manufacture of contacts upon semiconductor components, by means of which sintering temperatures substantially higher than those of known processes are permissible without destroying the semiconductor structure of the component.

These and other objects are achieved according to the invention by providing an improved process for the manufacture of electrical contacts on semiconductor components, wherein a metallic layer is placed upon the surface of the semiconductor component with which contact is to be made, which layer is then sintered by heating to a predetermined temperature, characterized by the fact that the heating done for sintering purposes takes place by means of irradiation with laser light directed only upon the metallic layer, the intensity of the laser light being sufficient to bring the metallic layer and the semiconductor material to the melting point. The laser radiation can be applied to the metallic layer through the semiconductor component from the side of the component opposite the side on which the metallic layer is applied.

A pulsed $CO_2$ laser radiating at a frequency at which the semiconductor material, such as silicium, is permeable, is used in a preferred embodiment of the process of the invention.

Also, laser irradiation can be used in like manner to bond a cooling body to the metallic layer.

In comparison with known procedures, the invention has the advantages that a contact surface in the area of heat sensitive structures can be sintered by localized heating, a shorter sintering time can be employed; and the sintering process can be carried out in air and does not require an inert atmosphere.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
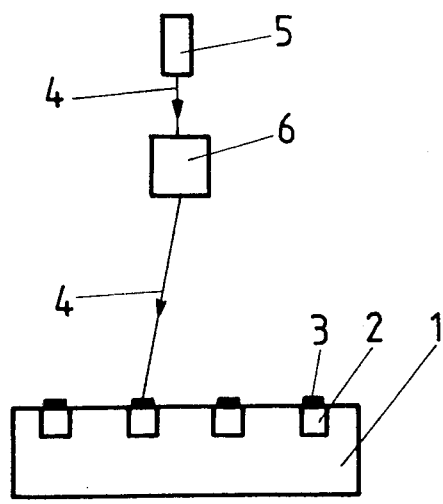
FIG. 1 is a schematic illustration of an arrangement for carrying out the process according to the invention.

Referring now to the drawings, wherein like reference numerals designate identical or corresponding parts throughout the several views, and more particularly to FIG. 1 thereof, a single semiconductor component (1) is illustrated, having four zones (2), each of which has a metallic layer (3), for example palladium or platinum. The formation of the corresponding silicides ($Pd_2Si$, Pt Si) occurs by means of irradiation of the metallic layer (3) with intensive laser light (4). This is supplied by a pulsed laser (5) which is coupled with an optical deflection device (6) and which, in turn, can be mechanically or electronically operated, for example.

When the metallic layer (3) is irradiated, the layer (3), as well as a thin layer of the silicium below it melts. At the same time an interdiffusion of silicium and metal takes place. When the laser pulse decays this melted layer begins to cool down. When the temperature of the metalsilicium mixture drops below the melting point, the material hardens. The corresponding silicides appear, or in the case of gold, silver, and aluminum, the corresponding alloys.

Figure 2:
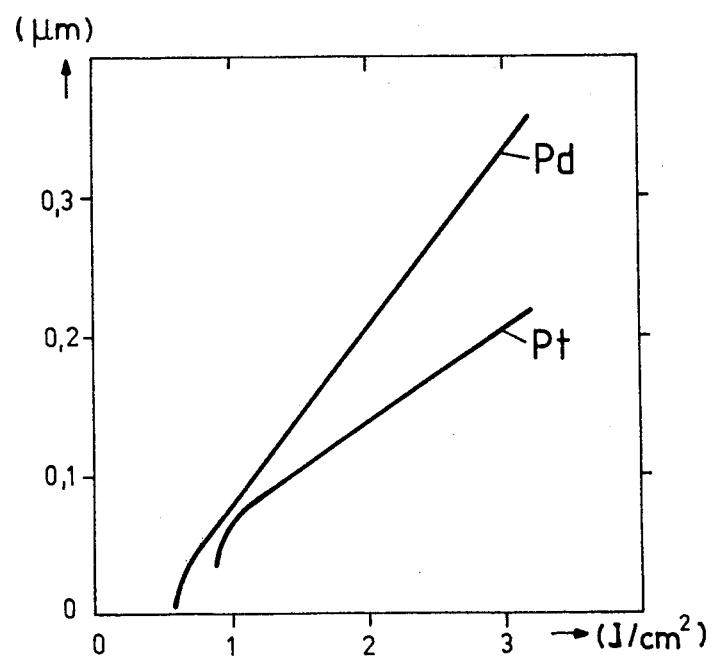
FIG. 2 is a graphic illustration depicting the relationship between the layer thickness of the contact metal (platinum and palladium respectively) and the energy intensity of the laser necessary for sintering at a given stage.

To achieve the energy density of the laser light necessary to melt the metallic layer (3), it is necessary to use pulsed lasers. In this regard it should be noted that with increasing thickness of the metallic layer (3), the energy density of the laser light must also increase. In FIG. 2 this relationship is illustrated for the metals palladium and platinum. There an Nd:YAG laser was used (available in general trade). The pulsation length was 18 ns.

Contact surfaces smaller than 1 $cm^2$ can be sintered with a single laser pulse; larger surfaces can be covered by means of several pulses combined with optical deflection of the laser beam.

Figure 3:
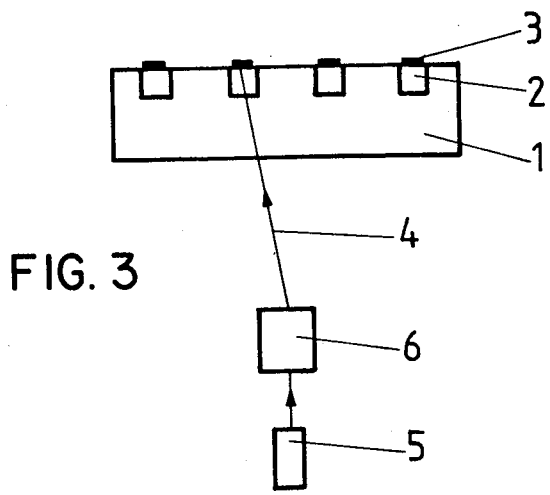
FIG. 3 is a schematic illustration of a further arrangement for carrying out the procedure according to the invention.

When a $CO_2$ laser is used, the metallic contact can also be sintered from the underside of the component, since silicium is transparent to $CO_2$ laser light. Such an arrangement is schematically illustrated in FIG. 3 (the reference numbers are the same as for FIG. 1). In particular, it is possible by means of this process to directly contact semiconductor components with a metallic cooling surface (e.g. copper or aluminum) by means of $CO_2$ laser light irradiated through the back of the semiconductor component, with the aid of a metal-silicium eutecticum (e.g. gold-silicium or aluminum-silicium). Such a process should become clearer with the help of FIGS. 4a and 4b, as is now explained.

Figure 4A:
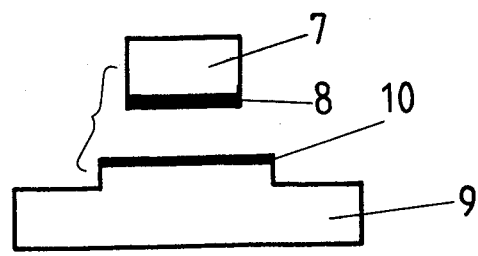
FIGS. 4a and 4b are schematic illustrations of the utilization of the process according to the invention for the contacting of a semiconductor component with a cooling body.
Figure 4B:
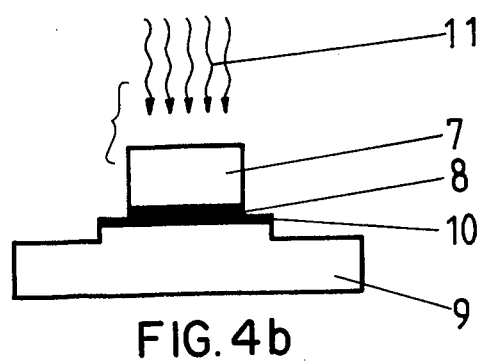

FIG. 4a shows a silicium component (7) upon which a layer (8) of gold about 2 to 4 μm thick is placed, as well as a cooling body (9) made of copper, for example, which also has a gold layer (10) which can be about 1 to 2 μm thick. The silicium component and the cooling body are brought into contact with one another such that the gold layers (8) and (10) are in contact. By means of the irradiation with $CO_2$ laser light (11) illustrated in FIG. 4b the contacting of the component with the cooling body (9) takes place. Later this also serves as a connection point for an electrode of the component (7).

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A process for the manufacture of electrical contacts on semi-conductor components, wherein a metallic layer having a thickness of between 0.05 and 0.3 μm is placed upon the surface of a semiconductor component with which contact is to be made, and the metallic layer is then sintered by heating to a predetermined temperature, comprising:

irradiating the metallic layer with laser light having an energy density between 1 and 3 Joule/cm$^2$ and an intensity sufficient to bring the metallic layer and the semiconductor material adjacent the metallic layer to the melting point.

2. A process as in claim 1, further comprising:

applying the laser irradiation via the surface of the semiconductor opposite the metallic layer; and,
    irradiating said metallic layer with laser light having a frequency at which the semiconductor material is permeable to the laser light.

3. A process as in claim 2, wherein:

said semiconductor component comprises a semiconductor material of silicium; and
    a $CO_2$ laser is used to produce said light in said irradiating step.

4. A semiconductor component manufactured by the process of claims 1, 2 or 3.

5. A process for the manufacture of electrical contacts on semiconductor components, wherein a metallic layer is placed upon the surface of a semiconductor component with which contact is to be made, and the metallic layer is then sintered by heating to a predetermined temperature, comprising:

irradiating the metallic layer with laser light having an intensity sufficient to bring the metallic layer and the semiconductor material adjacent the metallic layer to the melting point;
    applying the laser irradiation via the surface of the semiconductor opposite the metallic layer;
    irradiating said metallic layer with laser light having a frequency at which the semiconductor material is permeable to the laser light;
    placing said metallic layer in contact with a cooling body; and
    applying laser light radiation to the contacting portions of the metallic layer and the cooling body to fuse the same together.

6. A semiconductor component manufactured by the process of claim 5.

* * * * *